Figure 1:
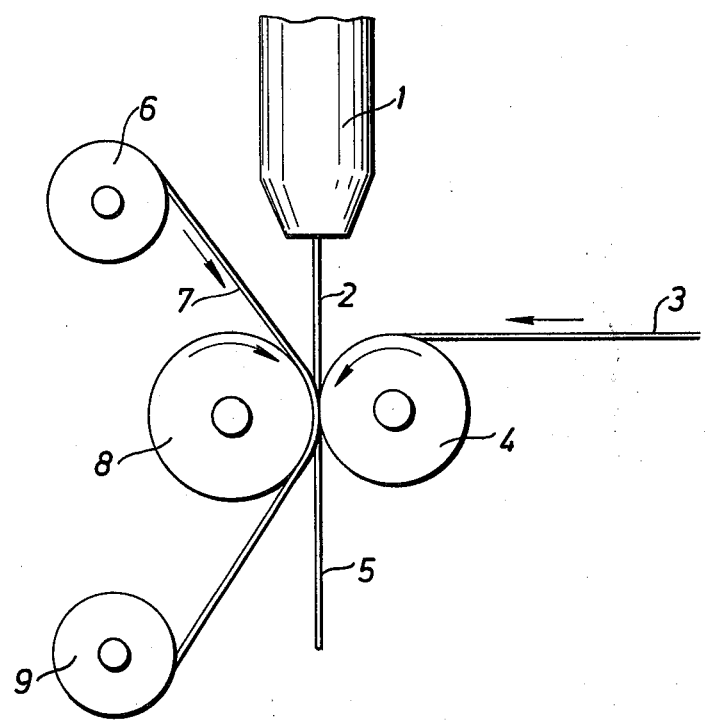

United States Patent [19]

Rausér

[11] 3,980,512
[45] Sept. 14, 1976

[54] METHOD OF TRANSFERRING DECORATIONS TO AN EXTRUDED WEB

[75] Inventor: Jan Axel Ingemar Rausér, Lomma, Sweden

[73] Assignee: AB Ziristor, Lund, Sweden

[22] Filed: Oct. 8, 1975

[21] Appl. No.: 620,753

Related U.S. Application Data

[63] Continuation of Ser. No. 450,054, March 11, 1974, abandoned.

[30] Foreign Application Priority Data

Mar. 21, 1973 Sweden.................... 7303959

[52] U.S. Cl. ................. 156/231; 101/470; 156/233; 156/238; 156/240; 156/244
[51] Int. Cl.² ............... B44C 1/14; B41M 5/26
[58] Field of Search ............ 101/32, 470; 156/231, 156/233, 238, 240, 244

[56] References Cited

UNITED STATES PATENTS

| 2,030,066 | 2/1936 | Jenett................ 101/32 X |
| 2,404,073 | 7/1946 | Karfiol et al............ 156/244 X |
| 2,477,300 | 7/1949 | Karfiol et al............ 101/32 X |
| 2,571,962 | 10/1951 | Smith et al........... 156/244 X |
| 2,887,051 | 5/1959 | Maunder............ 101/32 X |
| 3,010,861 | 11/1961 | Reese............... 156/244 X |
| 3,024,154 | 3/1962 | Singleton et al........ 101/32 X |
| 3,046,174 | 7/1962 | Brooks et al........ 156/244 X |
| 3,131,113 | 4/1964 | Arbit et al.......... 156/244 X |
| 3,232,818 | 2/1966 | Loew et al.......... 156/255 X |

FOREIGN PATENTS OR APPLICATIONS

| 241,041 | 4/1960 | Australia............. 156/244 |
| 869,076 | 5/1961 | United Kingdom........ 156/244 |
| 722,409 | 1/1955 | United Kingdom........ 156/244 |

*Primary Examiner*—Clyde I. Coughenour
*Attorney, Agent, or Firm*—Pierce, Scheffler & Parker

[57] ABSTRACT

A method for transferring decorative matter, especially metallic lustre to a plastic packing material web in which a polyethylene film having decorative printed matter applied to one face thereof and covered over with a very thin metallic layer is brought into contact with a face of the plastic packing material web, which is in a heated softened state, and passed between cooling and compression rollers. The very thin metallic layer with the decorative matter thereon separates from the polyethylene film and penetrates into the surface of the softened plastic packing material thus completing the desired transfer of the decorative matter.

1 Claim, 2 Drawing Figures

U.S. Patent  Sept. 14, 1976  3,980,512

METHOD OF TRANSFERRING DECORATIONS TO AN EXTRUDED WEB

This is a continuation of application Ser. No. 450,054, filed Mar. 11, 1974, now abandoned.

The present invention relates to a method for applying text and decoration to a material web, in particular packing material web or labelling web.

A need has existed for a long time for the imparting of a decoration with metallic lustre to packing material. This effect was achieved previously by covering the packing material with a metal foil. After application of the metal foil the packing material was printed in conventional printing presses with the object of imparting text and possibly pictures to the material. However, the method described is subject to certain disadvantages. The method is very uneconomical, since a relatively thick metal foil has to be used so that it should not break during rolling-up and coating. The process described is also very expensive, because the decoration has to be applied to the packing material in two stages, namely a first one when the metal foil is put on, and a second one when the packing material is printed.

Packing material coated with metal foil also constitutes an environmentally harmful factor, since the metal foil is not broken down in nature, whereas a packing material covered with a vacuummetalized layer is so broken down.

A further disadvantage of the said method is that the metal foil has a very high water vapour barrier, that is to say, the foil does not allow any water vapour to pass through. The metal foil thus hinders the moisture in the packing material from evaporating, which may give rise to the packing material becoming soft and the package losing its stiffness.

The metal foil covering the packing material has a very good conductivity, which means that the risk of a short circuit during sealing is very great both when sealing jaws with directly heated band or when induction heat are used.

The said disadvantages are overcome by the use of the method in accordance with the present invention for the imparting of text and decoration to a material web, characterized in that a first plastic film, called decoration film, which previously has been coated with a thin metal layer, e.g. by vacuum metallizing, is brought into contact with a second plastic film constituting or included in the abovementioned material web, which second plastic film is heated to its plastic temperature range, whereupon the first and the second plastic films are passed between cooling and compression rollers while the metal layer is made to stick with good adhesion to the said second plastic film, whereupon finally the decoration film is detached from the metal layer transferred to the said second plastic film.

Figure 2:
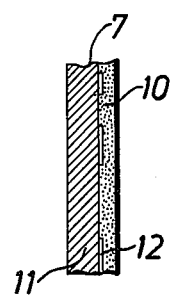

In the following the method will be described in connection with the enclosed drawing, on which FIG. 1 shows a device for the transfer of the decoration and FIG. 2 shows a cross-section of the web from which the decoration is transferred.

The device shown in FIG. 1 comprises mainly a nozzle 1 through which a plastic film, heated to its plastic range, is extruded, a magazine roll 6 on which a prefabricated plastic film with loosely applied decoration is stored, a cooling roller 8 and a compression roller 4 between which the plastic films 7 and 2 are pressed against one another at the same time as the plastic film 2 is laminated with a carrier layer 3, and finally a magazine roll 9 on which the plastic film 7 is wound up after the decoration has been transferred to the laminate 5.

The prefabricated film 7, hereinafter called the decoration film, consists preferably of a polyethylene film, which is coated with a thin layer of metal 10, and a suitable thickness is then 100 – 4000 A, preferably 100 – 500 A. This is done by vacuum-metallizing, that is to say the metal is vaporized and the vapour is made to condense on the film. By the said method a very thin layer of metal can be obtained which owing to its discontinuity and porosity is permeable for water vapour. The said property, that water vapour can pass through, is valuable when it is desired to hinder that the package after filling loses its stiffness because of a softening of the packing material. As the said metal layer, which preferably may be of aluminium, is intended to be transferred to a packing material web, the adhesion between the metal layer 10 and the plastic film 11 must be smaller than the adhesion between the metal layer and the packing material web. To reduce the adhesion on the decoration film 7, it is appropriate therefore to use as carrier layer 11 on the decoration film 7 a nonpolar plastic film, since the adhesive power is inferior on this type of plastic film. In certain types of packages it is also desirable to apply an informative or advertising type of text and picture. For this purpose it is appropriate if the plastic film is printed in the conventional manner before it is coated with the aforementioned metal layer. To facilitate the transfer of the printing ink to the packing material, the ink must have such a composition that it softens at a relatively low temperature. Suitable additives to the printing ink are different types of wax. The transfer is also facilitated if a layer of wax or some other medium with a low melting point is applied to the plastic film before the text and the picture are printed. The transfer of the text and the decoration from the decoration film 7 to the material web 2 takes place in that the said decoration film is pressed against a plastic film manufactured in an extruder. This extruded plastic film should on the occasion of the transfer have such a high temperature that it is soft and plastic, the metal layer 10 applied to the decoration film penetrating into the surface of the extruded plastic film. This penetration into the surface of the plastic film is necessary in order that the adhesion between metal layer and the extruded film should become so good, that the metal layer can easily be detached from the plastic film 11.

When the heat from the extruded plastic film 2 heats up the metallized coating and the printing ink 12 located between this coating and the plastic film 11, the said ink, because of its content of material with low melting point, will soften and consequently detach itself from the plastic film 11. The same effect is achieved if a material with a low melting point is coated between the printing ink 12 and the plastic film 11. Because of the discontinuity and porosity of the metal layer the hot plastic will penetrate through the metal layer and stick to the ink layer 12 which prevents the printing ink from detaching itself from the metal layer 10.

Immediately after the decoration film and the packing material have been brought into contact with each other, the said films are made to pass between rollers and then suitable cooling and compression rollers, in order that the metal layer of the decoration film should be made to penetrate into the surface of the hot extruded film and that the extruded plastic layer should be cooled and stabilized. When the decoration film has passed the said rollers, it is free from its layer of printing ink and metal, which have been transferred to the packing material, and it can then be used again after it has been wound up on a magazine roll 9.

Since it is often desirable to laminate the extruded plastic film 2 against another material with the object of obtaining a more rigid packing material, it is suitable to carry out this lamination at the same time as when the decoration is transferred from the decoration film to the extruded film. This process is shown in FIG. 1, where the material web 3 consists of a more rigid material such as paper, cardboard or foam plastic. The abovementioned, transferred metal layer has a very high mechanical strength so that text and decoration also can be applied to the metallized layer by conventional methods after the same has been transferred to the packing material web. To increase the strength of the transferred decoration, it may be suitable in certain cases to coat the side of the packing material web onto which the decoration has been applied with an extruded plastic layer or lacquer.

By the use of the aforementioned method of coating the packing material with a metal layer, a further advantage achieved is that the transparency of the packing material is reduced compared with material which lacks such a layer. This had previously been a problem, because certain types of materials filled are very light-sensitive.

The method described for imparting a text or decoration to a material web and in particular to a packing material web or labelling web, can within the scope of the invention also be applicable to material webs which do not contain any extruded plastic layer. To the material web, to which the metal layer is to be applied, is imparted an adhesion-promoting material, e.g. a hot-melt material. The metal layer will then stick to the adhesion-promoting material, which will have the result that the said metal layer is made to detach itself from the decoration film. The application of the adhesion-promoting material must then take place appropriately, depending upon which type of adhesion material is used, immediately when or just before the material web is brought into contact with the decoration film.

I claim:

1. A continuous method of making a plastic material web having thereon a decoration including a layer of metal particles, which method consists essentially in the following sequence of steps:

preparing a decoration film (7) by coating a carrier film 11 of a non-polar polyethylene plastics with a discontinuous layer of a printing ink (12), applying thereover a thin coating of a vapor-porous layer (10) of metal particles consisting essentially of aluminum, by vacuum-metallizing on one side thereof, said vapor-porous layer having a thickness of 100–4000 A;

heating a body of a plastics material to an elevated temperature at which the plastics is soft and plastic;

extruding the so-heated and softened plastics in the form of a hot, extruded web (2) of a plastics material having greater adhesion to said metal particles layer than that of said carrier film;

bringing one surface of said freshly extruded, hot plastics web (2) into contact with the coated side of said decoration film (7) and the other surface of said plastics web (2) into contact with a carrier layer web (3);

passing the resulting composite of decoration film (7), plastics web (2) and carrier layer web (3) between cooling and compression rollers thereby causing a metal layer (10) to penetrate and adhere to plastics web (2) and plastics web (2) to laminate with carrier layer web (3) as a final decorated material web;

detaching said carrier film 11 from the metal layer surface of the final decorated material web; and recovering the so-freed carrier film and reusing it in preparing a fresh supply of decoration film.

* * * * *